(12) United States Patent
Avanessian et al.

(10) Patent No.: US 7,941,780 B2
(45) Date of Patent: May 10, 2011

(54) INTERSECT AREA BASED GROUND RULE FOR SEMICONDUCTOR DESIGN

(75) Inventors: Albrik Avanessian, Watertown, MA (US); Henry A. Bonges, III, Milton, VT (US); Dureseti Chidambarrao, Weston, CT (US); Stephen E. Greco, Lagrangeville, NY (US); Douglas W. Kemerer, Essex Junction, VT (US); Tina Wagner, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 421 days.

(21) Appl. No.: 12/105,299

(22) Filed: Apr. 18, 2008

(65) Prior Publication Data

US 2009/0265673 A1    Oct. 22, 2009

(51) Int. Cl.
*G06F 17/50* (2006.01)
(52) U.S. Cl. ............ 716/132; 716/51; 716/52; 716/100; 716/110; 716/135
(58) Field of Classification Search .................. 716/2, 5, 716/7, 8, 19, 21, 51, 52, 100, 110, 111, 112, 716/118, 132, 135
See application file for complete search history.

(56) References Cited

U.S. PATENT DOCUMENTS

| 4,735,881 | A | * | 4/1988 | Kobayashi et al. | 430/30 |
| 5,995,878 | A | * | 11/1999 | Miyajima | 700/121 |
| 6,040,114 | A | * | 3/2000 | Inoue et al. | 430/296 |
| 6,316,163 | B1 | * | 11/2001 | Magoshi et al. | 430/296 |
| 6,763,508 | B2 | * | 7/2004 | Igarashi et al. | 716/119 |
| 6,800,428 | B2 | * | 10/2004 | Okada et al. | 430/394 |

* cited by examiner

*Primary Examiner* — Sun J Lin
(74) *Attorney, Agent, or Firm* — Scully, Scott, Murphy & Presser, P.C.; H. Daniel Schnurmann

(57) ABSTRACT

A design rule that determines a degree of overlap between two design elements in two adjoining levels by estimating a physical overlap area, or an "intersect area," of corresponding structures in a semiconductor chip is provided. The estimation of the physical intersect area may factor in line edge biasing, critical dimension tolerance, overlay tolerance, and corner rounding to provide an accurate estimate of a physical area for each of the structures corresponding to the two design elements. The intersect area is employed as a metric to determine compliance with a ground rule, i.e., the ground rule is specified in terms of the intersect region. Other derived quantities such as electrical resistance, electromigration resistance, expected yield may be calculated from the intersect area, and may be advantageously employed to optimize the design data.

25 Claims, 10 Drawing Sheets

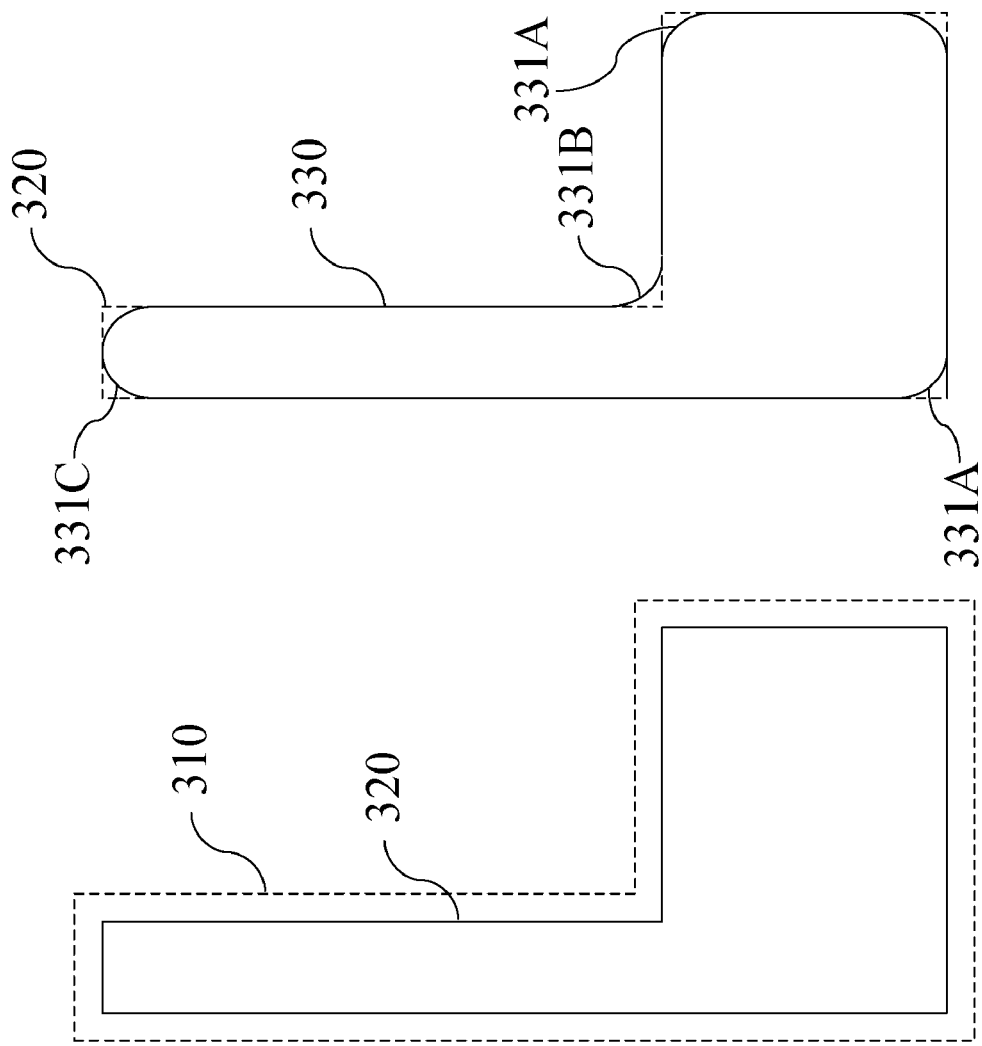
FIG. 3C
FIG. 3B
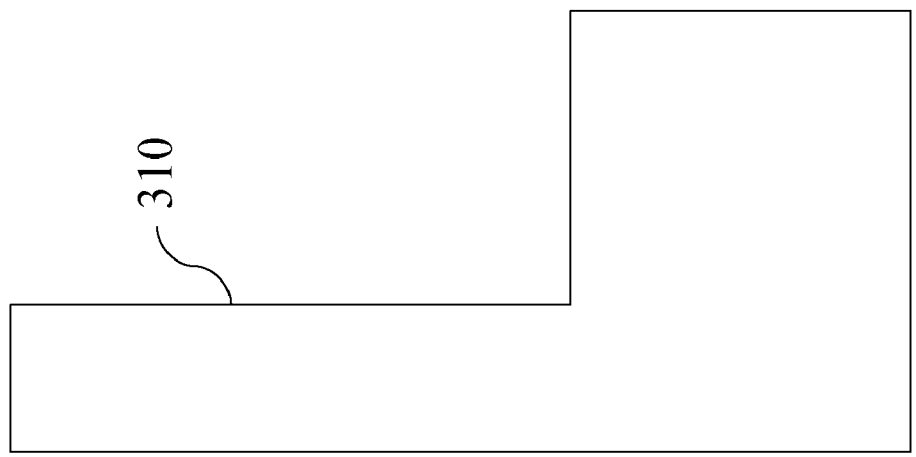
FIG. 3A

INTERSECT AREA BASED GROUND RULE FOR SEMICONDUCTOR DESIGN

FIELD OF THE INVENTION

The present invention relates to a method of providing a model calculation for a semiconductor design employing a ground rule based on an intersect area calculation between vertically adjoining levels, and to a semiconductor design methodology, and particularly, to a semiconductor design methodology employing a ground rule based on such an intersect area calculation for checking and/or improving a semiconductor device design.

BACKGROUND OF THE INVENTION

Ground rules are rules or algorithms applied to the design data for a semiconductor chip in the design phase. In the design phase, the designers follow the design rule during a logic synthesis step and a placement and routing step. A design rule checking program, which is typically released to designers as part of a technology platform, provides an automated method of checking the design data for any violations of the ground rules. Thus, the design rules serve as a systematic mechanism to insure that a semiconductor chip design is compatible with capabilities of manufacturing processes employed in the semiconductor technology. Conformity of a given design data to the design rules improves the probability of obtaining a reasonable yield from physical semiconductor chips, that is, semiconductor chips manufactured in a semiconductor chip fabrication facility, that conforms to the ground rules of the semiconductor technology. Practically, barring any systematic or logical errors in the design data, a high degree of conformity to the ground rules correlate to a high yield in manufacturing.

Despite the benefits that the ground rules provide in terms of yield management, the ground rules pose limitations between the various elements of the design data during the design phase. Of particular concern is the limitation on the shapes in a design level due to the constraint of a minimum overlap with another level, which is typically a level directly above or directly below. For example, a metal line contacting a via therebelow or a via thereabove needs to have a certain minimum overlap to insure that sufficient electrical contact is present between the metal line and the via. Likewise, a minimum overlap is sometimes required between a structure in a polysilicon conductor (PC) level and another structure in a recessed oxide (RX) level.

Typically, a complex set of ground rules are provided to insure that such structures meet or exceed a minimum level of overlap. For example, metal lines, vias, or other shaped in relevant levels are required to have one of predefined widths, lengths, or other geometric limitations. In many cases, such ground rules are provided as a complex set of logical instructions including alternatives and/or combinations, making understanding of such ground rules by designers time-consuming and/or challenging. Also, such ground rules tend to limit choices for the designers and reduce the flexibility in the design of semiconductor devices rather severely.

In addition, the ground rules are also set up such that semiconductor devices meet a certain level of performance criteria even in the worst combination of relevant ground rules. By construction, therefore, the ground rules insure that a model calculation of model parameters would satisfy a minimum performance specification such as electrical resistance of a contact between a line and a via, electromigration resistance of a contact between a line and a via, and/or expected yield of a particular contact structure or an overlap structure. A downside of such an approach is that many designs are unintentionally over-engineered, i.e., provides more than sufficient performance when the elements of the design data are not configured to provide worst combinations. Such over-engineering may result in a significant increase in the area that the designs take up compared to an optimally design, which would violate some of the ground rules but would still deliver sufficiently satisfactory performance.

In view of the above, there exists a need for a method of providing a design data that meets performance specification without resorting to ground rules comprising a complex set of logical instructions. Specifically, there exists a need for simplified ground rules that are less restrictive to the design data.

Further, there exists a need for enabling a model calculation for such a design data based on such simplified ground rules. In addition, there exists a need for a semiconductor design methodology employing such ground rules to check and/or improve a semiconductor device design.

SUMMARY OF THE INVENTION

To address the needs described above, the present invention provides a design rule that determines a degree of overlap between two design elements in two adjoining levels by estimating a physical overlap area, or an "intersect area," of corresponding structures in a semiconductor chip. The estimation of the physical intersect area may factor in line edge biasing, critical dimension tolerance, overlay tolerance, and corner rounding to provide an accurate estimate of a physical area for each of the structures corresponding to the two design elements. The intersect area is employed as a metric to determine compliance with a ground rule, i.e., the ground rule is specified in terms of the intersect area. Other derived quantities such as electrical resistance, electromigration resistance, expected yield may be calculated from the intersect area, and may be advantageously employed to optimize the design data.

According to an aspect of the present invention, a method for designing a semiconductor chip is provided. The method comprises:

determining an intersect area between a first projected physical area of a first design shape and a second projected physical area of a second design shape;

determining whether the intersect area is equal to or exceeds a predetermined value;

modifying at least one of the first and second design shape if the intersect area is less than the predetermined value, until the intersect area is equal to or exceeds the predetermined value;

creating a design data comprising at least the first and second design shapes; and designing the semiconductor chip based upon the design data.

According to another aspect of the present invention, another method for designing a semiconductor chip is provided, which comprises:

determining an intersect area between a first projected physical area of a first design shape and a second projected physical area of a second design shape;

determining whether the intersect area is equal to or exceeds a predetermined value;

determining whether a value for a physical quantity derived from the intersect area is within a predefined specification for the physical quantity;

modifying at least one of the first and second design shapes if the intersect area is less than the predetermined value or if the value is outside the predefined specification, until the intersect area is equal to or exceeds the predetermined value and the physical quantity is within the predefined specification;

creating a design data comprising at least the first and second design shapes; and designing the semiconductor chip based upon the design data.

BRIEF DESCRIPTION OF THE DRAWINGS

FIGS. 3A-3C illustrate an exemplary process of applying line edge biasing and corner rounding to a design shape according to the present invention.

DETAILED DESCRIPTION OF THE INVENTION

Figure 1:
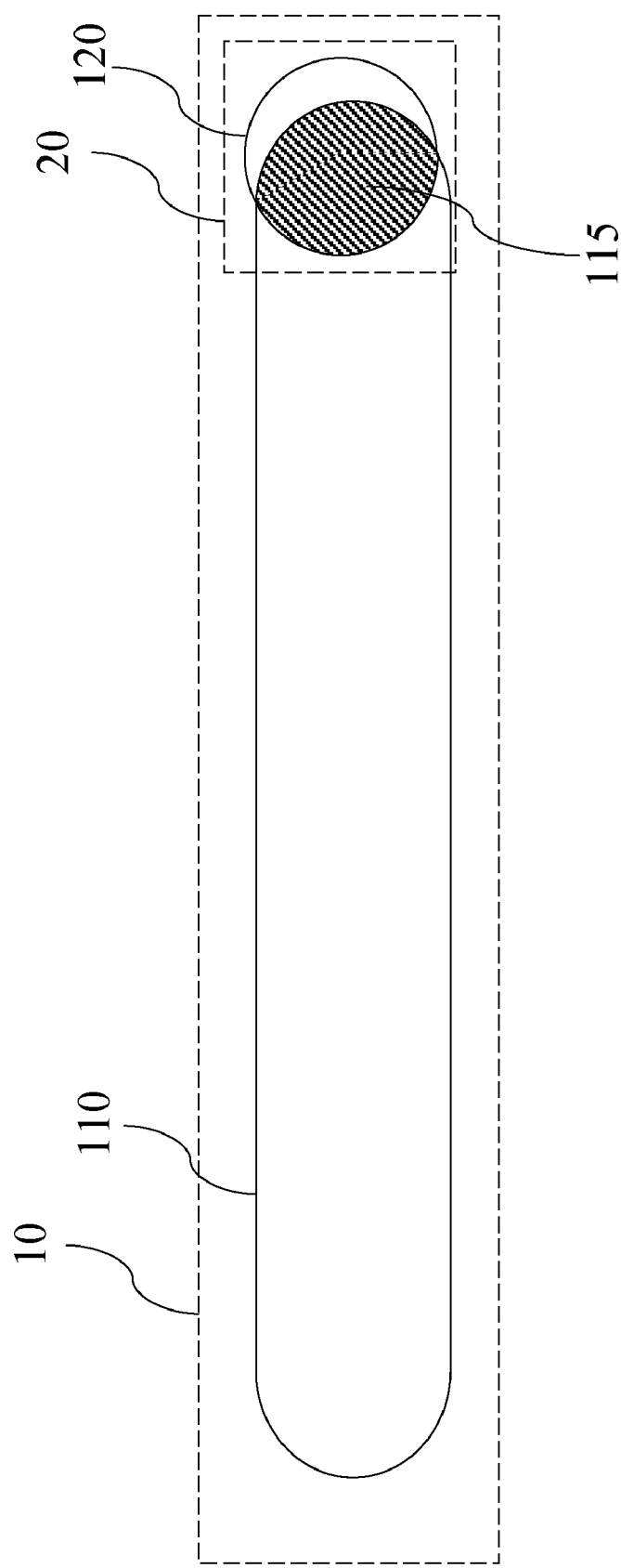
FIG. 1 is an overlay of a physical line structure and a physical via structure in a semiconductor chip with a first design shape representing the physical line structure and a second design shape representing the physical via structure in a design data. The physical intersect region is defined by the overlapping area of the physical line structure and the physical via structure.

As stated above, the present invention relates to a method of providing a model calculation for a semiconductor design employing a ground rule based on an intersect area calculation between vertically adjoining levels, and to a semiconductor design methodology, and particularly, to a semiconductor design methodology employing a ground rule based on such an intersect area calculation for checking and/or improving a semiconductor device design, which are now described in detail with accompanying figures. It is noted that like reference numerals refer to like elements or like steps.

Referring to FIG. 1, a first design shape 10 and a second design shape 20 in a design dataset is shown. The first design shape 10 resides, that is, is present within a class of design shapes belonging to, a first design level and the second design shape 20 resides in a second design level. The first design level and the second design level are different. The first design level and the second design level may be adjacent design levels representing physical structures that are adjoined to each other, or separated design levels representing physical structures separated from each other. For example, the first design level may be a level containing design shapes representing a conductive line such as a metal line, a metal semiconductor alloy line, a doped semiconductor line, or an active semiconductor area, and the second design level may be a level containing design shapes representing a conductive via such as a metal via. The metal line is located in back-end-of-line (BEOL) interconnect structures. The metal semiconductor alloy line is located on a semiconductor substrate or on a doped semiconductor line comprising a gate conductor and may comprise a metal silicide. The doped semiconductor line may comprise doped polysilicon or a doped semiconductor alloy, and the active semiconductor area has a single crystalline semiconductor material and is surrounded by shallow trench isolation structures. The metal via may be a contact array (CA) via contacting a metal semiconductor alloy line underneath, a doped semiconductor line underneath, an active semiconductor area underneath, or a metal line above. The metal via may also be located in a BEOL interconnect structure and contact a metal line underneath. Alternately, the first design level and the second design level may represent design shapes that are physically disjoined such as a gate conductor line and active area within a semiconductor substrate.

While the present invention is described with figures showing each of the first design shape 10 and the second design shape 20, it is understood that each of the first design shape 10 and the second design shape 20 may be a collection of shapes such as a set of contact vias, a set of metal lines, a set of gate conductor lines, or a set of active semiconductor areas. Thus, a first design shape 10 comprising a collection of shapes may be contacting a second design shape comprising another collection of shapes.

It is noted that the first design shape 10 and the second design shape 20 may be represented in a variety of formats. Specifically, the first design shape 10 and the second design shape 20 may be represented in the form of schematics or hardware description language (HDL; e.g. Verilog, VHDL, C, etc.). The first design shape 10 and the second design shape 20 may also be contained on one or more machine readable medium. For example, the first design shape 10 and the second design shape 20 may be a text file or a graphical representation of a semiconductor structure to be subsequently manufactured as a semiconductor chip. In a design process, the first design shape 10 and the second design shape 20 are typically synthesized, i.e., translated, into a netlist containing a variety of semiconductor device elements and describing, among other things, the connections between the semiconductor devices in an integrated circuit design. The net list is typically recorded on at least one of machine readable medium. For example, the medium may be a CD, a compact flash, other flash memory, a packet of data to be sent via the Internet, or other networking suitable means. The synthesis may be an iterative process in which the netlist is resynthesized one or more times depending on design specifications and parameters for the circuit.

For the description of the present invention, a geometrical representation of the first design shape 10 and the second design shape 20 is employed. When such geometrical representations are juxtaposed over projected physical areas, i.e., physical areas likely to be occupied by physical structures corresponding to the geometrical representations, the effects of the manufacturing processes employed in the manufacture of semiconductor chips are collectively captured in the projected physical areas. Specifically, the first design shape 10 produces a first physical structure in a semiconductor chip such that the first physical structure has a first projected physical area 110. Likewise, the second design shape 20 produces a second physical structure in the semiconductor chip such that the second physical structure has a second projected physical area 120.

The various effects of the manufacturing processes, which are manifested as the difference between the first and second design shapes (10, 20) as represented in the geometrical forms and the first and second projected physical areas (110, 120), include line edge biasing, corner rounding, and other distortions introduced into the physical structure by lithographic processes and etch processes. The first projected physical area 110 is the area of a first physical structure, which is a physical implementation of the first design shape 10 in a semiconductor chip. The second projected physical area 120 is the area of a second physical structure, which is a physical implementation of the first design shape 10 in a semiconductor chip. The first projected physical area 110 and the second projected physical area may refer to the areas of top surfaces, areas of bottom surfaces, or the areas at midheight of the first and second physical structures, respectively.

Typically, a relevant area is selected for comparison of the first and second design shapes (10, 20) and the first and second projected physical areas (110, 120). For example, if the first design shape 10 represent a metal line and the second design shape 20 represents a conductive via located directly beneath the metal line, the relevant area for the first design shape 10 is the area of the metal line at the bottom surface of the metal line, and the relevant area for the second design shape 20 is the area of the conductive via at the top of the conductive via. If the first design shape 10 represent a metal line and the second design shape 20 represents a conductive via located directly above the metal line, the relevant area for the first design shape 10 is the area of the metal line at the top surface of the metal line, and the relevant area for the second design shape 20 is the area of the conductive via at the bottom of the conductive via. In each case, the relevant area represents the physical area of each design shape (10 or 20) at the interface between the two design shapes (10, 20).

The correlation between a design shape and a corresponding projected physical area may be provided by process assumptions, which is a set of rules for extracting a projected physical area for any design shape based on the level of the design shape and the geometry of the design shape. Typically, the process assumptions are released as part of a design tool kit for each semiconductor technology generation to help simulate the physical properties of semiconductor devices to be manufactured. The process assumptions may be updated with changes in the manufacturing process for the semiconductor technology to reflect any changes in the manufacturing process or updated information as information accumulates during manufacturing.

An intersect region 115, which is the hatched area in FIG. 1, between the first projected physical area 110 and the second projected physical area is the estimation of a physical contact area between the first physical structure and the second physical structure. The true area of the physical contact varies from semiconductor chip to semiconductor chip since the manufacturing process invariably introduces some variations in the physical dimensions of each of the first physical structure and the second physical structure (known as critical dimension variations, or "CD variations") and overlay variations between the first physical structure and the second physical structure. The first projected physical area 110 is thus a "projected" area, i.e., a calculated area that is derived from the first design shape 10 based on the process assumptions. Likewise, the second projected physical area 120 is also a projected area that is derived from the second design shape 20 based on the process assumptions. Thus, the intersect region 115 is also a calculated entity based on the first projected physical area 110 and the second projected physical area 120. The area of the intersect region 115 is herein referred to an "intersect area."

The intersect area may be a scalar or a distribution depending on the methods used in the calculation. For example, if only median shapes or mean shapes representing the median or mean of the first and second projected physical areas (110, 120) are employed for calculation of the intersect area, the intersect area is given by a number, i.e., a scalar, representing the overlap area of the median shapes or the mean shapes. If statistical distributions are employed to represent the first and second projected physical areas (110, 120), for example, by employing percentile or sigma based variations in the first and second projected physical areas (110, 120), the intersect area is given by a statistical distribution providing percentile or sigma based variations in the area of the intersect region 115.

According to the present invention, a design rule to be employed in generating and/or checking the design data for a semiconductor chip stipulates that the intersect area between the first and second projected physical areas (110, 120) is equal to, or is greater than, a predefined value. Such a predefined value is derived from considerations for functionality and yield considerations for a semiconductor device to be manufactured. For example, if the semiconductor device requires a certain level of current and the electrical wiring system of the semiconductor technology is capable of handling a current density up to a predefined level between a metal line and a metal via, the predefined value for the intersect area is set such that the current density at the interface between a first structure corresponding to the first design shape 10 and the second structure corresponding to the second design shape is less than the predefined level. Such a design rule may also be applied to two levels that do not produce abutting structures. For example, a minimum intersect area may be predefined between the area of a physical gate electrode and an active area or a shallow isolation trench structure. In this case, the design rule may state that the intersect area between a projected physical image for the gate electrode and another projected physical image for the active area or the shallow trench isolation structure is equal to or is greater than the predefined minimum intersect area between the relevant two levels.

If the intersect area is given by a statistical distribution, the design rule may be a limitation on a statistical quantity of the intersect area. For example, the design rule may stipulate that a 3-sigma variation, or a 6-sigma variation, of the distribution representing the intersect area is equal to or greater than a predefined minimum contact area that may be derived from device performance and yield considerations.

Some design rules may be required as part of a semiconductor technology, and all semiconductor chip designs are expected to comply with such design rule. In addition, there may be design rules intended to enhance projected yield of the semiconductor chip designs, or "design for manufacturability" (DFM) rules. Such design rules are also termed "yield rules," "recommended rules," and "manufacturability rules."

The design rules apply to the design phase and associated checking phase of a semiconductor chip design.

In semiconductor manufacturing, overlap of a metal line with a metal via may have a large impact on chip yield. The present invention provides the flexibility to optimize a semiconductor chip design beyond the traditional, overconstrained type of ground rules so that the semiconductor chip design provides an enhanced manufacturing yield.

Figure 2:
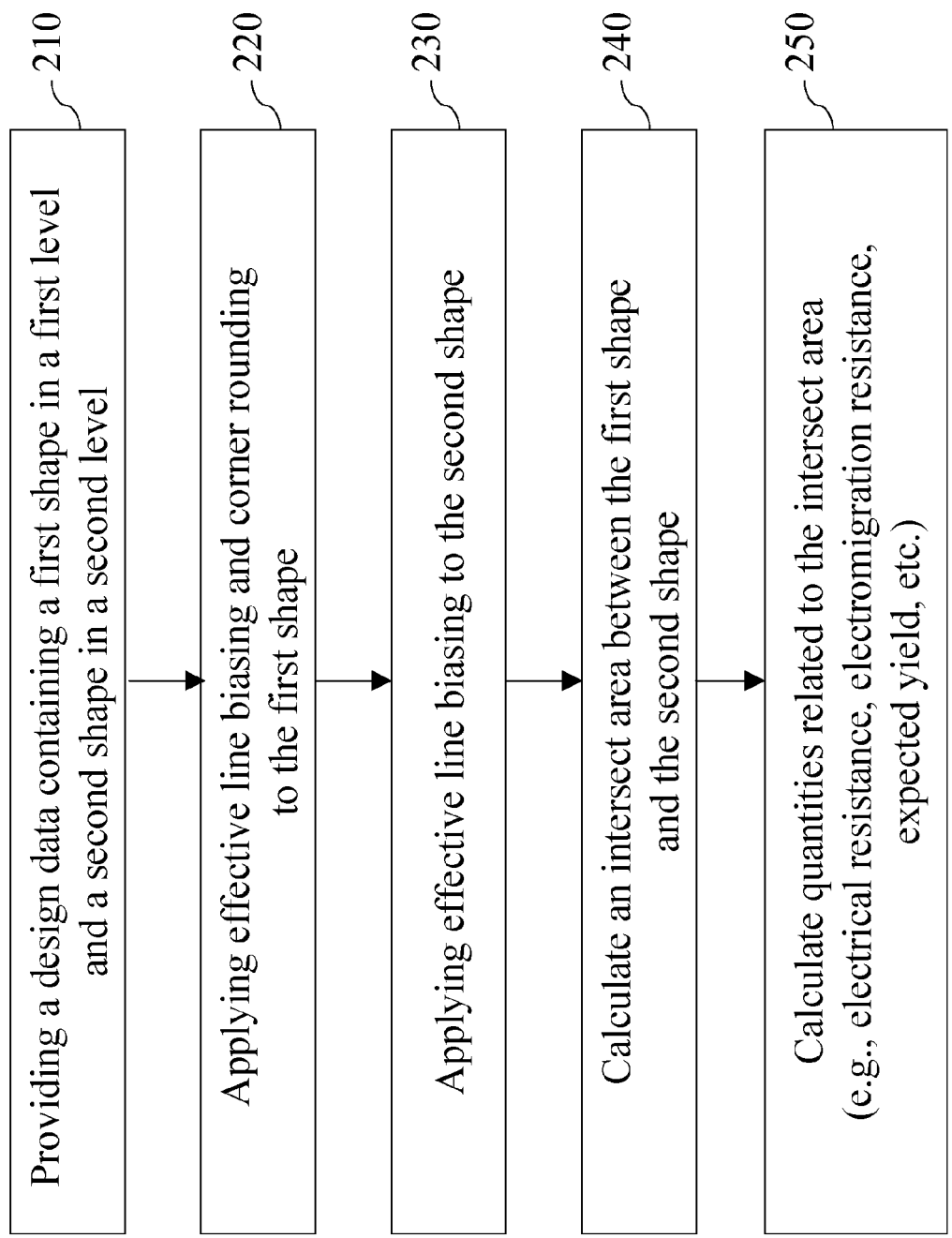
FIG. 2 is a flowchart showing a first method of applying an intersect area based ground rule between a line structure and a via structure according to the present invention.

Referring to FIG. 2 a first flow diagram representing a first method of employing an intersect area based design rule is schematically shown. Referring to step 210, a design data containing a first shape in a first level and a second shape in a second level is provided. As described above, the first design data resides in a first design level and the second design data resides in the second design level. The design data may be in a graphical format, a netlist format, or in any other alternative format suitable to data manipulation.

According to the first method, the first design level and the second design level are adjoining levels that results in physically abutting structures. The first design level contains design shapes corresponding to conductive lines. The second level contains design shapes corresponding to conductive vias located directly above the conductive lines in a semiconductor chip, or alternatively, corresponding to conductive vias located directly below the conductive lines in the semiconductor chip. The conductive lines may comprise a metal as in the case of back-end-of-line (BEOL) wiring structures, or may comprise a metal semiconductor alloy or a conductive semiconductor material, which is typically doped with p-type dopants or n-type dopants, as in the case of front-end-of-the line (FEOL) gate conductor lines or metal semiconductor structures such as a metal silicide.

Referring to step 220, a first projected physical area is obtained by applying a line edge bias correction and a corner rounding correction to the first shape. The line edge biasing correction is obtained from the process assumptions of the semiconductor technology on which the design data is based. The line edge bias correction and/or the corner rounding correction may be calculated for nominal cases by employing median or mean changes between the first shape and the first projected physical area, or may be calculated for a percentile, per mill, or sigma-based variations on the side of lesser total area for the first projected physical area. For example, if a −3 sigma variation is desired for the first projected physical area, the calculation process uses line edge correction values and a corner rounding values corresponding to the −3 sigma process variations. The area of the first physical structure fully encompasses the first projected physical area calculated for the −3 sigma variation scenario with the probability corresponding to the −3 sigma, i.e., approximately 99.865% of the time, or approximately in 99.865% of semiconductor chips manufactured.

The process of applying the line edge bias correction and the corner rounding correction is illustrated in FIGS. 3A-3C. FIG. 3A shows a first design shape 310 residing in a first design level of a design data. The first design shape 310 comprises a polygonal shape that is conducive to programming. Typically, the first design shape 310 is specified by the coordinates of the vertices of the geometrical shape, which is a geometrical representation of the first design shape 310. As such, the first design shape 310 has dimensions that would be translated into physical dimensions were it not for the physical limitations of lithographic processes and etch processes employed in the manufacturing of semiconductor chips. The differences between the first design shape 310 and the shape of a first physical structure manufactured in a semiconductor chip and corresponding to the first design shape 310 is an inherent consequence of the manufacturing process. The differences are captured as process assumptions, one of which is line edge biasing and another is corner rounding.

Referring to FIG. 3B, a first intermediate projected physical area 320 is calculated by applying a line edge bias correction to the first design shape 310. The first intermediate projected physical area 320 is a computed geometrical shape that is obtained by applying only the offset between edges of the first design shape 310 and an expected shift in the location of corresponding edges in a first physical structure corresponding to the first design shape.

The line edge bias correction may include the effects of some of process variations, or preferably, the totality of process variations employed in semiconductor manufacturing. Such process variations include variations in the dimensions of lithographic images, which is typically referred to as critical dimension (CD) variations as well as overlay variations between the lithographic images of the first design level and the lithographic images of the second design level. Effects of etch bias variations may also be included in the calculation of the amount of line edge bias correction. If the CD variations, the overlay variations, and the etch bias variations are independent of one another, the total variation due to the three components is equal to the square root of the sum of squares of the three components, i.e., the squares of variations are additive if the underlying mechanisms for generating the component variations are independent.

Referring to FIG. 3C, a first projected physical area 330 is calculated by applying a corner rounding correction to the intermediate projected physical area 320. The corner rounding correction approximates the lithographic effects that tend to round any pointy features in the design data into a more round shape. Thus, a corner having an angle $\alpha 1$ less than 180 degrees within the first intermediate projected physical area 320 tends to be lost in the first projected physical area 330 and turn into a rounded corner 331A, and a corner having another angle $\alpha 2$ greater than 180 degrees within the first intermediate projected physical area 320 tends to be filled in the first projected physical area 330 and turn into a webbed corner 331B. Such corners may be approximated by an arc of a circle, of which the radius depends on the features of the intermediate projected physical area 320 around which the corner rounding correction is performed. In practice, the radius of the arc may vary to produce a continuous shape for narrow features of the shape, and may be fixed when the features retain dimensions above a certain threshold feature dimension, which is typically about 100 nm to about 200 nm as of 2008. The first projected physical area 330 contains an arced end 331C of a narrow line in FIG. 3C.

The line edge biasing correction shown in FIG. 3B may be calculated for a nominal case corresponding to a median or mean for the expected location of edges in the first physical structure, or alternately, the line edge biasing correction may be calculated for a statistically significant probabilistic distribution to provide a manufacturing friendly estimate for electrical characteristics or yield. In the same manner, the corner rounding correction shown in FIG. 3C may be calculated for a nominal case corresponding to a median or mean for the expected location of edges in the first physical structure, or alternately, for a statistically significant probabilistic distribution. For example, −3 sigma value may be calculated for the line edge biasing correction and the corner rounding correction so that the area represented by the first projected physical area 330 is completely covered by the corresponding first physical structure in approximately 99.865% of semiconductor chips.

Referring to step 230 of FIG. 2, a second projected physical area is obtained by applying an effective via biasing correction the second shape, which is a shape of a conductive via. The effective via biasing is obtained from the process assumptions of the semiconductor technology on which the design data is based.

Figure 4B:
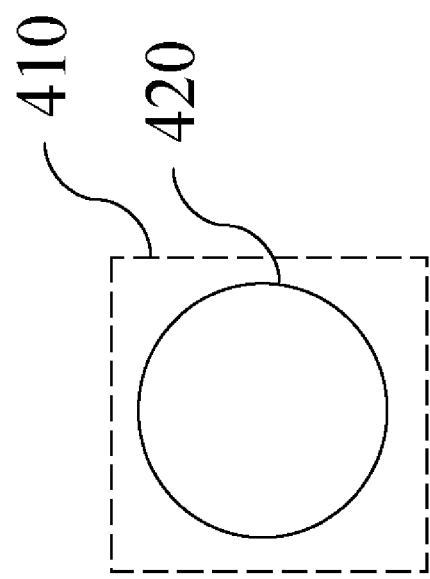
FIGS. 4A and 4B illustrate an exemplary process of applying effective via biasing to a design shape according to the present invention.
Figure 4A:
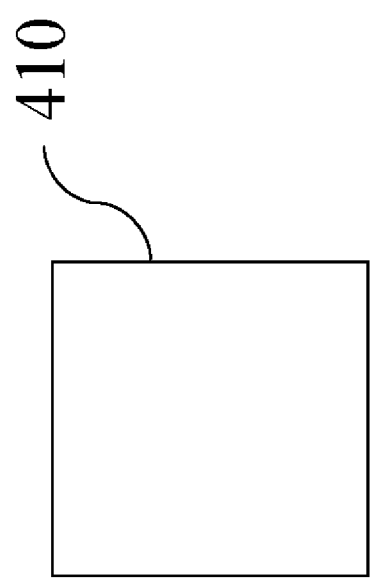

The process of applying the effective via biasing correction is illustrated in FIGS. 4A-4C. FIG. 4A shows a second design shape 410 residing in a second design level of the design data. The second design shape 410 comprises a polygonal shape that is conducive to programming. Typically, the second design shape 410 is a square, which may be specified by the coordinates of a vertex or a center position, or a rectangle which is typically specified by coordinates of vertices. The second design shape 410 shown herein is a geometrical representation of the second design shape 410.

Primarily due to lithographic limitations, the polygonal shape of the second design shape is typically translated into a second physical structure having a circular area or an elliptical area. The differences between the second design shape 410 and the shape of a second physical structure manufactured in the semiconductor chip and corresponding to the second design shape 410 is an inherent consequence of the manufacturing process. The process assumptions capture the difference between the second design shape 410 and the shape of the second physical structure. The projected shape for the second physical structure based on the process assumptions is the second projected physical area 420, which is shown in FIG. 4B.

The effective via biasing correction may include the effects of some of process variations, or preferably, the totality of process variations employed in semiconductor manufacturing. Such process variations include variations in the dimensions of lithographic images, which is typically referred to as critical dimension (CD) variations. Effects of etch bias variations may also be included in the calculation of the amount of line edge bias correction. If the CD variations and the etch bias variations are independent of each other, the total variation due to the two components is equal to the square root of the sum of squares of the two components, i.e., the squares of variations are additive if the underlying mechanisms for generating the component variations are independent. Since the overlay variations between the images of the first level and the images of the second level have already been considered during the line edge biasing that is described in FIG. 3B, the overlay variations need not be considered at this point. In a variation of this embodiment, however, the overlay variations may be considered during the effective via biasing correction instead of during the line edge biasing correction.

The effective via biasing correction may be calculated for nominal cases by employing median or mean changes between the second shape 410 and the second projected physical area 420, or may be calculated for a percentile, per mill, or sigma-based variations on the side of lesser total area for the second projected physical area 420. For example, if a −3 sigma variation is desired for the second projected physical area 420, the calculation process uses effective via biasing correction values corresponding to the −3 sigma process variations. The area of the second physical structure fully encompasses the second projected physical area 420 calculated for the −3 sigma variation scenario with the probability corresponding to the −3 sigma, i.e., approximately 99.865% of the time, or approximately in 99.865% of semiconductor chips manufactured.

Referring to step 240 of FIG. 2, an intersect area, or the overlapping area, between the first projected physical area 320 (See FIG. 3C) and the second projected physical area (See FIG. 4B) is calculated. Graphically, the intersect area is the same as the intersect area of the intersect region 115 in FIG. 1. Suitable algorithms may be employed to calculate the intersect area based on the computed location of the first projected physical area 320 and the computed location of the second projected physical area.

Referring to step 250 of FIG. 2, other physical quantities related to the intersect area may then be calculated. The physical quantities may include electrical quantities such as electrical resistance of the interface between the first physical structure (corresponding to the first design shape) and the second physical structure (corresponding to the second design shape). Another electrical quantity that may be calculated is electromigration resistance of the interface between the first physical structure and the second physical structure. Such physical quantities may be calculated based on the intersected area obtained at step 240.

Further, the physical quantity may be expected functional yield of the collective structure of the first physical structure and the second physical structure over a specified time period, which may be the expected lifetime of the semiconductor chip. Other useful quantities that may be calculated from the intersect area may also be calculated as needed.

Figure 5:
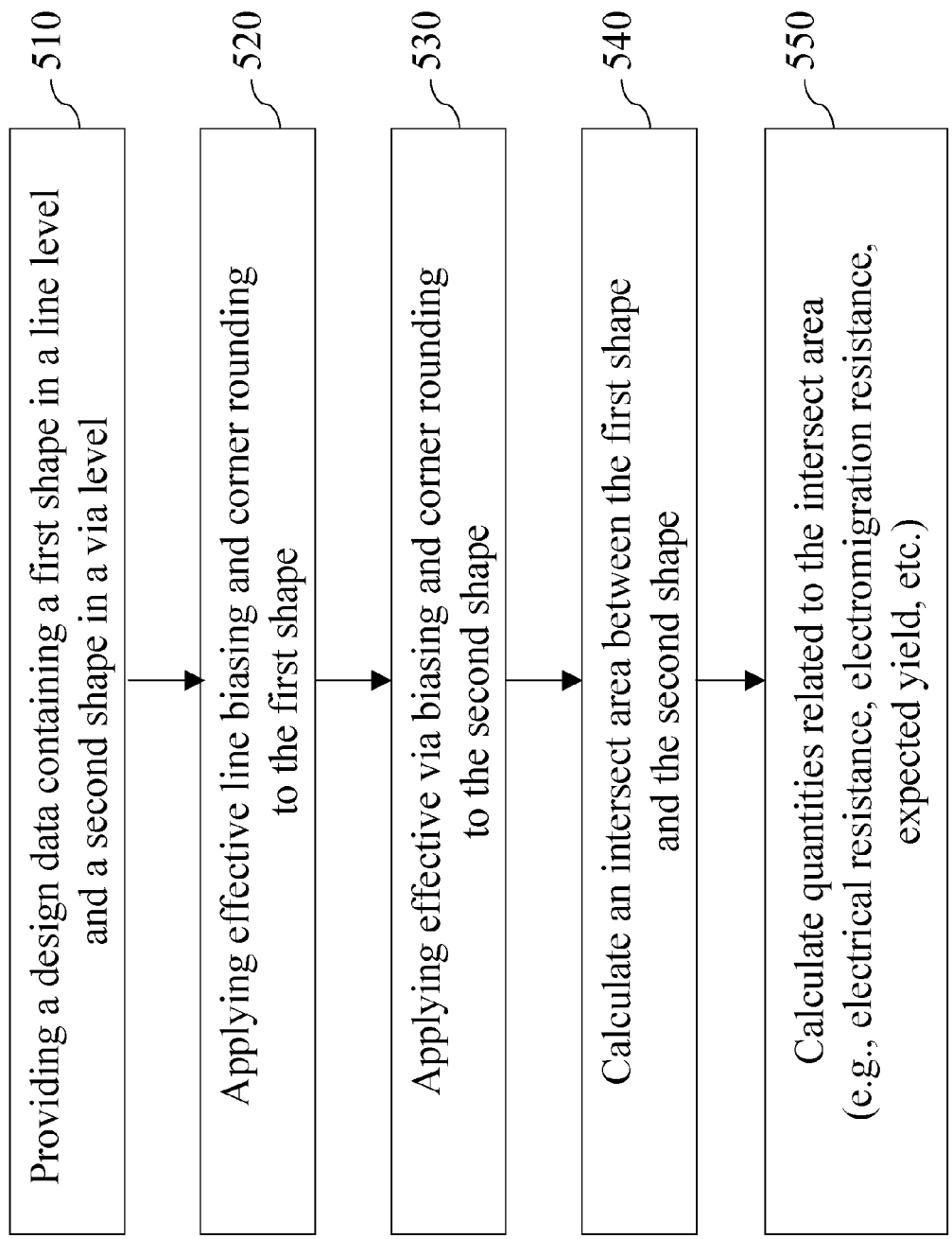
FIG. 5 is a flowchart showing a second method of applying an intersect area based ground rule between two structures each requiring line edge biasing and corner rounding according to the present invention.

Referring to FIG. 5, a second flow diagram representing a second method of employing an intersect area based design rule is schematically shown. According to the second method, The second design level is not a via level, but is instead a level containing structures to have some overlay with the first design level. The first design level and the second design level may be separated levels that result in disjoined physical structures having an intervening structure therebetween. For example, the first level may be a polysilicon conductor (PC) level and the second level may be a recessed oxide (RX) level or an active area (AA) level. In this case, the intervening structure may be a gate dielectric layer.

Referring to step 510, a design data containing a first shape in a first level and a second shape in a second level is provided in the same manner as at step 210 of the first method. Referring to step 520, a first projected physical area is obtained by applying a line edge bias correction and a corner rounding correction to the first shape in the same manner as at step 220 of the first method.

Referring to step 530, line edge biasing and corner rounding is applied to the second design shape in a manner similar to the line edge biasing and the corner rounding applied to the first design shape in step 520. The line edge biasing to the second design shape does not include components from variations in the overlay between the images of the first design level and the images of the second design level since the overlay variations have already been considered during the application of line edge biasing to the first design shape in step 520. As in the first method, the considerations for the overlay variations may be included in the line edge biasing of the second design shape instead of the line edge biasing of the first design shape.

Referring to step 540, an intersect area between the first projected physical area 320 and the second projected physical area is calculated in the same manner as at step 240 of the first method. Referring to step 550, other physical quantities related to the intersect area may then be calculated as at step 250 of the first method.

Figure 6:
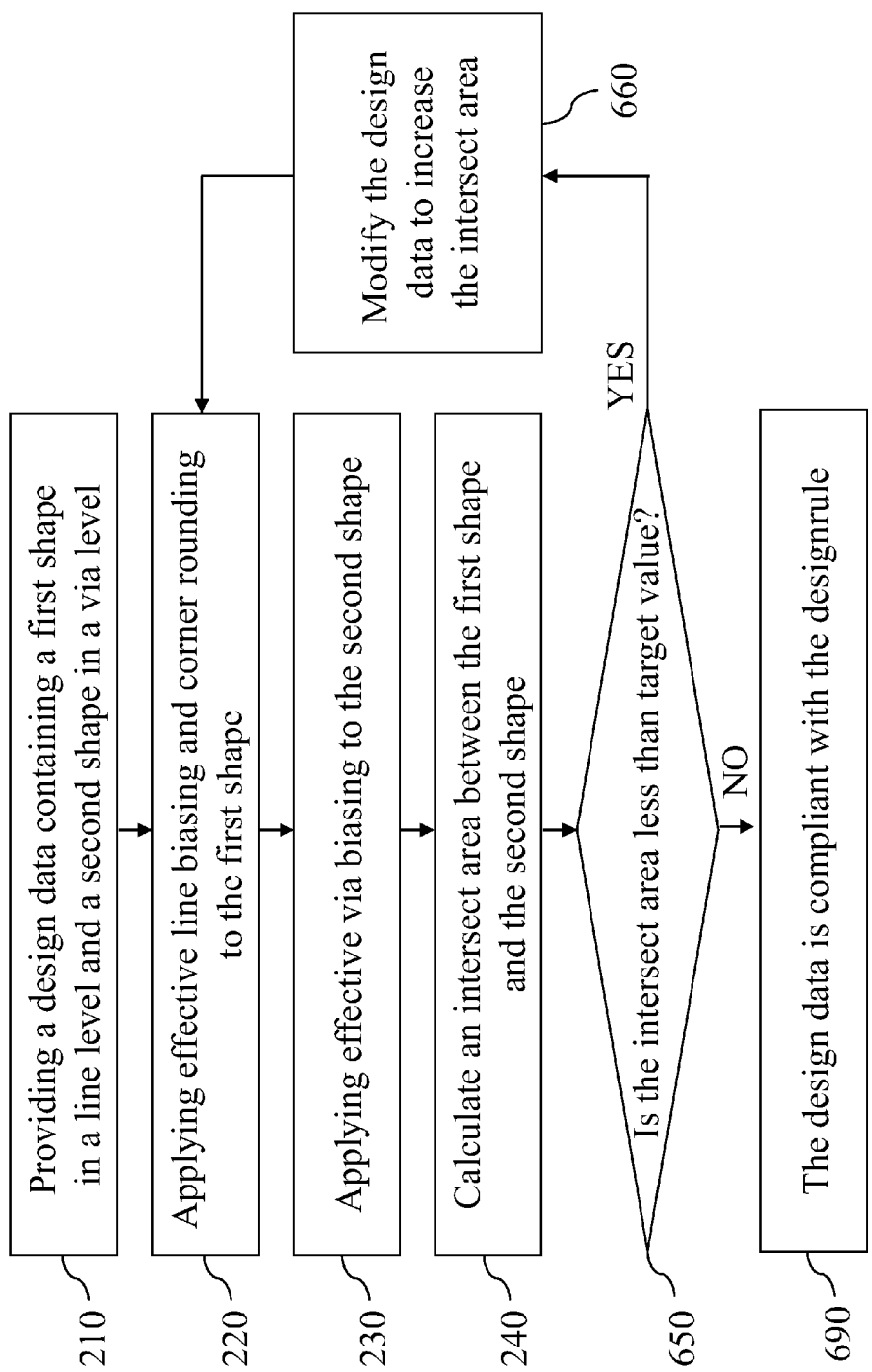
FIG. 6 a flowchart showing a third method of applying an intersect area based ground rule iteratively between a line structure and a via structure to optimize a design data to meet the ground rule according to the present invention.

Referring to a FIG. 6, a third flow diagram representing a third method of employing an intersect area based design rule is schematically shown. The third method employs the steps 210-240 of the first method as described above. Once the intersect area is calculated, step 650 is performed to test whether the design data is compliant with the ground rule of the present invention. The ground rule employed in this scheme is that the calculated intersect area should exceed the predetermined minimum intersect area. Thus, the calculated intersect area is compared with a predetermined minimum intersect area, which is a target value for the calculated intersect area to meet or exceed. If the calculated intersect area is equal to or is greater than the predetermined minimum intersect area, the design data is compliant with the ground rule and the flow sequence proceeds to step 690, at which the determination that the design data is compliant with the ground rule is made known to an operator or to an automated program.

If the calculated intersect area is less than the predetermined minimum intersect area, the design data is modified to improve compliance with the design rule at step 660. For example, at least one of the first design shape and the second design shape may be modified near the intersect region so that the intersect area increases. Further, if the calculated intersect area exceeds the predetermined minimum intersect area by a predetermined percentage level, e.g., 10% or 20%, the first design shape and the second design shape may be modified near the intersect region so that the intersect area decreases and a more compact design is provided. This process may be iteratively applied until compliance with the design rule is achieved, i.e., until the intersect area is equal to or exceeds the predetermined minimum contact area, and/or the intersect area does not exceed the predetermined minimum intersect area by more than the predetermined percentage level.

Figure 7:
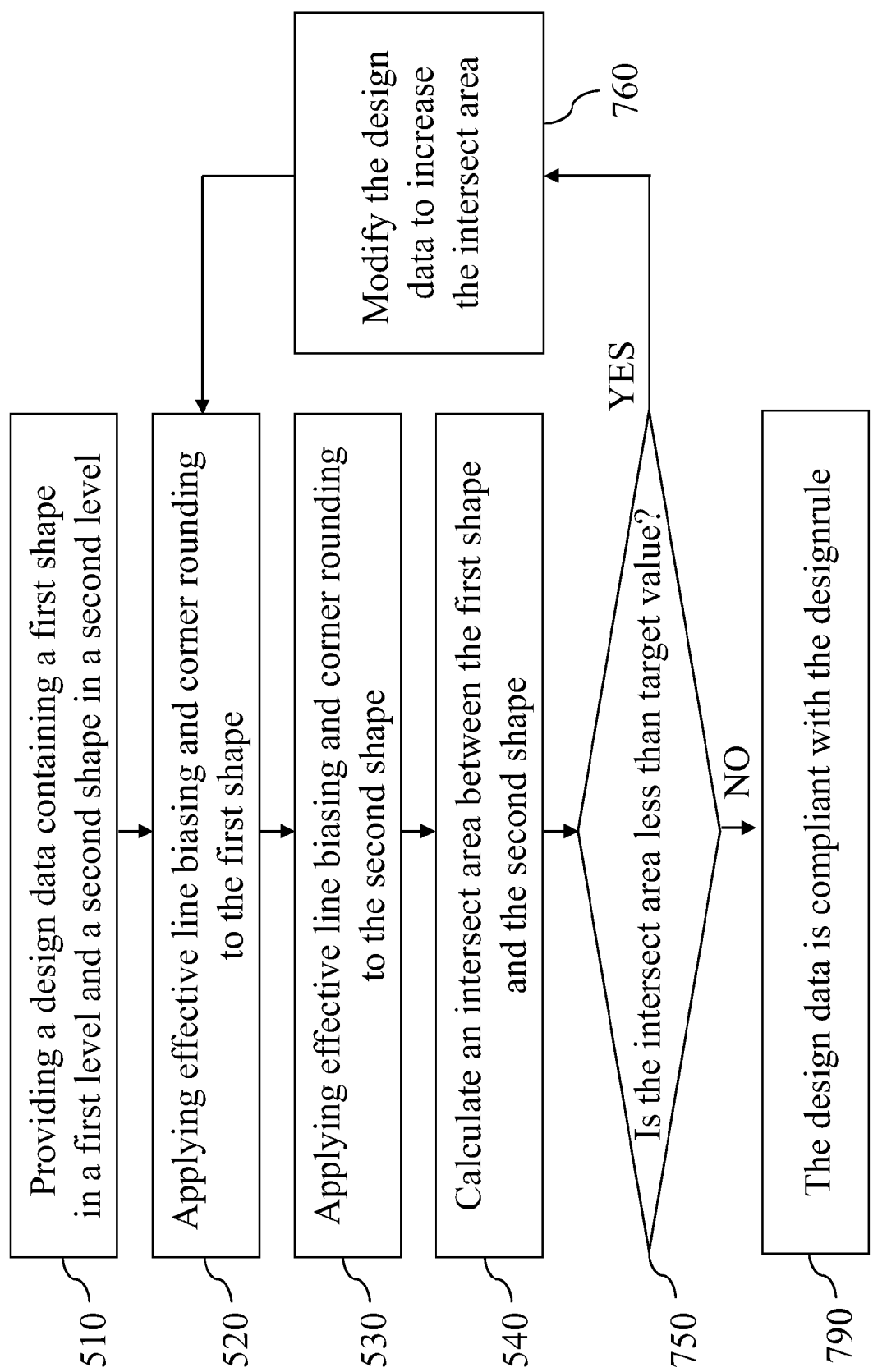
FIG. 7 is a flowchart showing a fourth method of applying an intersect area based ground rule iteratively between two structures each requiring line edge biasing and corner rounding to optimize a design data to meet the ground rule according to the present invention.

Referring to a FIG. 7, a fourth flow diagram representing a fourth method of employing an intersect area based design rule is schematically shown. The fourth method employs the steps 510-540 of the second method as described above. At step 750, compliance of the design data with the ground rule of the present invention is tested as at step 650 of the third method. If the calculated intersect area is equal to or is greater than the predetermined minimum intersect area, the design data is compliant with the ground rule and the flow sequence proceeds to step 790, which is equivalent to step 690 of the third method.

If the calculated intersect area is less than the predetermined minimum intersect area, the design data is modified to improve compliance with the design rule at step 760. For example, at least one of the first design shape and the second design shape may be modified near the intersect region so that the intersect area increases. In addition, at least one additional via may be introduced into the design, along with any necessary extension of the boundaries of the first shape as needed, to increase the total intersect area between the first shape and the collection of the second shape and the newly introduced via(s). Further, if the calculated intersect area exceeds the predetermined minimum intersect area by a predetermined percentage level, e.g., 10% or 20%, the first design shape and the second design shape may be modified near the intersect region so that the intersect area decreases and a more compact design is provided. In addition, if the second shape comprises more than one via, at least one via may be removed to generate a more compact design. This process may be iteratively applied until compliance with the design rule is achieved, i.e., until the intersect area is equal to or exceeds the predetermined minimum contact area, and/or the intersect area does not exceed the predetermined minimum intersect area by more than the predetermined percentage level.

Figure 8:
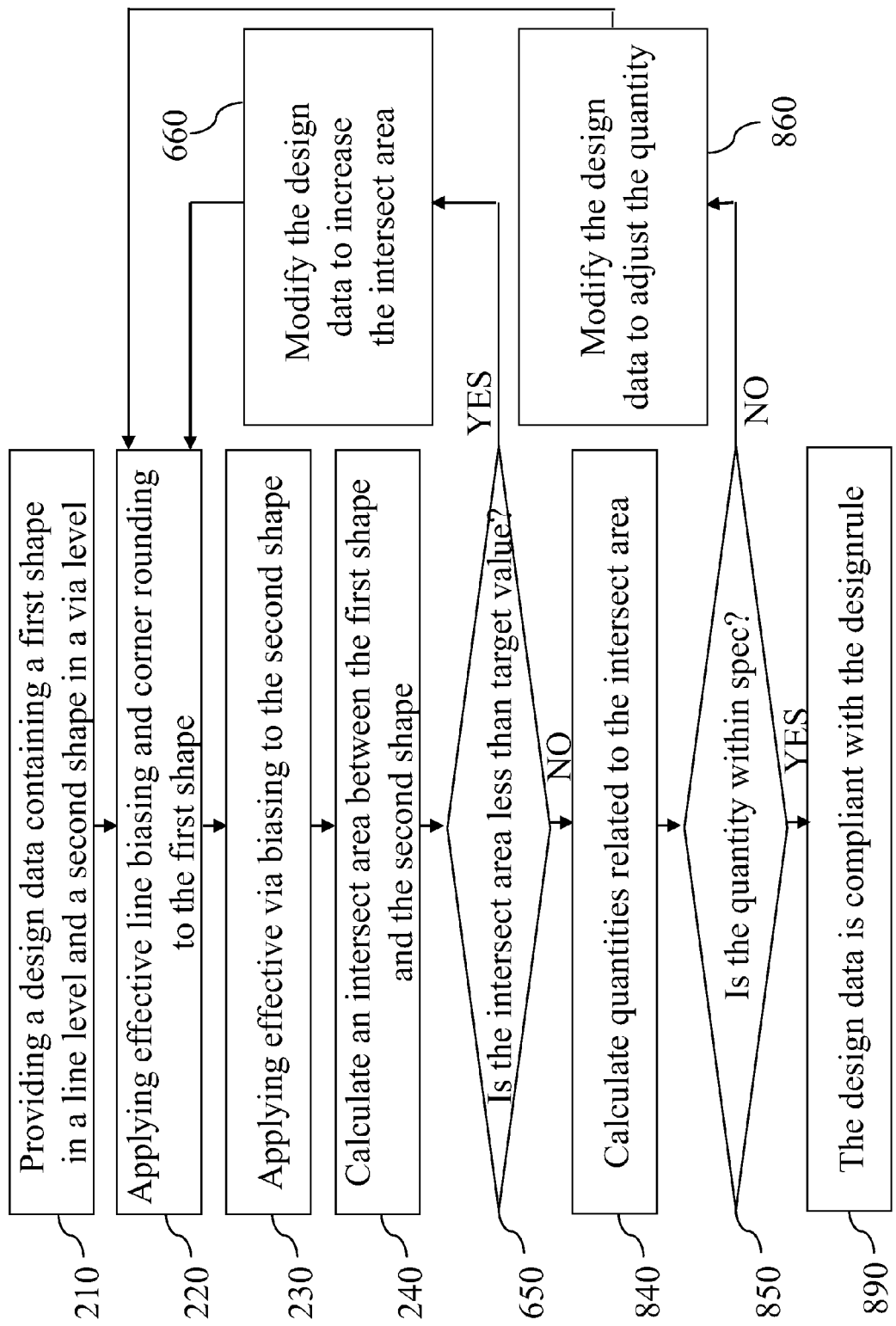
FIG. 8 a flowchart showing a fifth method of applying an intersect area based ground rule iteratively between a line structure and a via structure to optimize a design data to meet a specification for a physical quantity related to an intersect area according to the present invention.

Referring to a FIG. 8, a fifth flow diagram representing a fifth method of employing an intersect area based design rule is schematically shown. The fifth method employs the steps 210-240 of the first and third methods and the steps 650 and 660 of the third method in the same manner as described above.

Additional steps are performed according to the fifth method. Once it is determined at step 650 that the calculated intersect area is equal to or is greater than the predetermined minimum contact area, i.e., the design data is compliant with the ground rule of the present invention, step 840 is performed at which a physical quantity related to the intersect area is calculated in the same manner as at step 250 of the first method.

Referring to step 850, the calculated physical quantity, which may be electrical resistance, electromigration resistance, or an expected functional yield of the collective structure of the first physical structure and the second physical structure, is compared with a specification for the physical quantity, which has a predefined range of values for passing values. A single calculated physical quantity may be checked at this step or multiple calculated physical quantities may be checked at this step. If all of the calculated physical quantities of concern are within the specification range, the design data meets all relevant specifications and the flow sequence proceeds to step 890, at which the determination that the design data is compliant with the ground rule and meets all specifications that were checked at step 850 is made known to an operator or to an automated program.

If any of the calculated physical quantities is outside the corresponding specification range, the design data is modified to bring relevant physical quantity within the specification at step 860. Specifically, at least one of the first design shape and the second design shape is modified near the intersect region such that the relevant calculated physical quantity is brought closer to the corresponding specification range. This process may be iteratively applied until compliance with the design rule and satisfaction of all of the specifications are simultaneously achieved, i.e., until the intersect area is equal to or exceeds the predetermined minimum contact area and all the calculated physical quantities are within their respective specification ranges.

Figure 9:
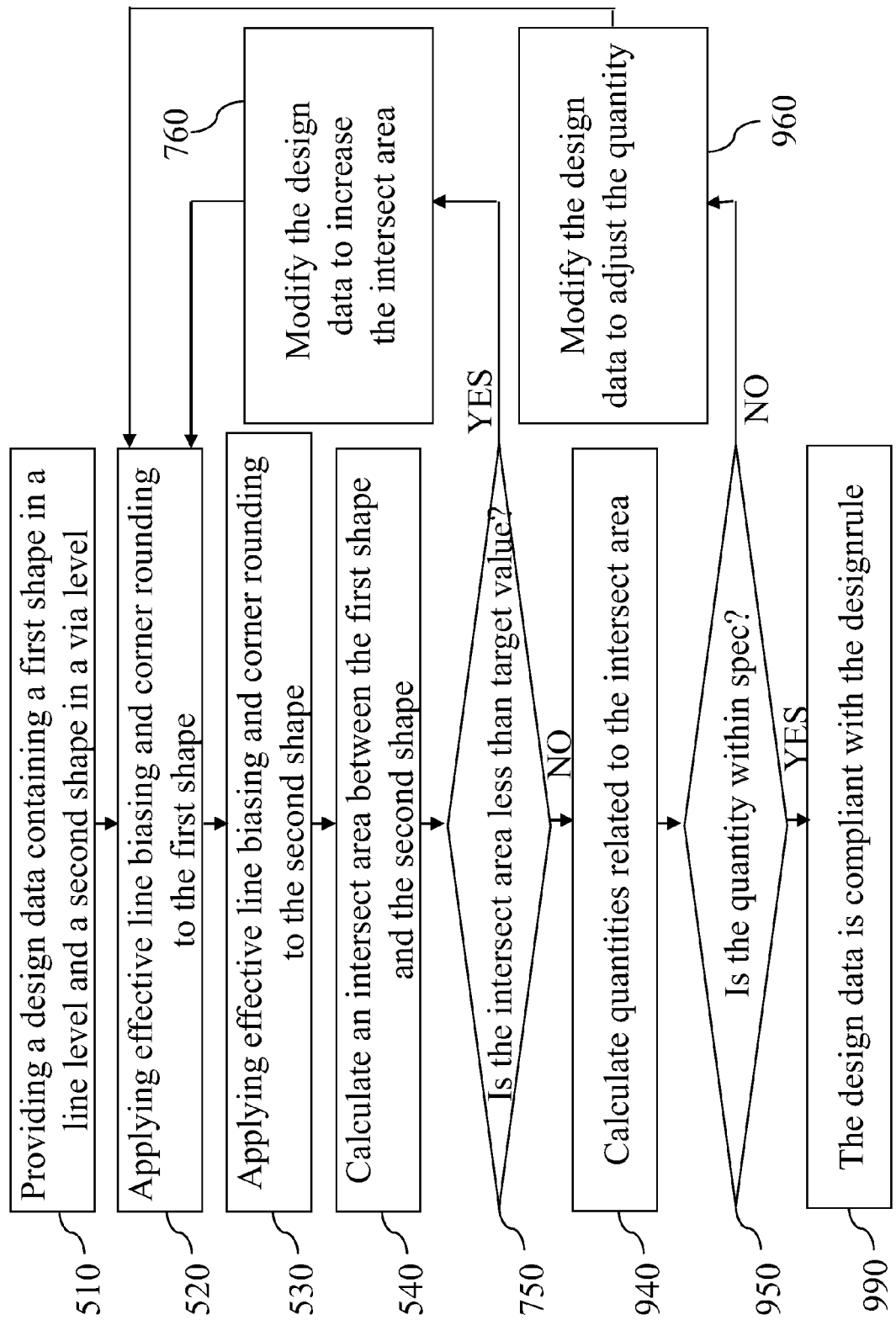
FIG. 9 is a flowchart showing a sixth method of applying an intersect area based ground rule iteratively between two structures each requiring line edge biasing and corner rounding to optimize a design data to meet a specification for a physical quantity related to an intersect area according to the present invention.

Referring to a FIG. 9, a sixth flow diagram representing a sixth method of employing an intersect area based design rule is schematically shown. The sixth method employs the steps 510-540 of the second and fourth methods and the steps 750 and 760 of the fourth method in the same manner as described above.

Additional steps are performed in a similar manner to the fifth method. Once it is determined at step 750 that the calculated intersect area is equal to or is greater than the predetermined minimum contact area, step 940 is performed at which a physical quantity related to the intersect area is calculated as at step 840 of the fifth method.

Referring to step 950, the calculated physical quantity, which may be electrical resistance, electromigration resistance, or an expected functional yield of the collective structure of the first physical structure and the second physical structure, is compared with a specification for the physical quantity as at step 850 of the fifth method. If all of the calculated physical quantities of concern are within the specification range, the design data meets all relevant specifications and the flow sequence proceeds to step 990, which is the equivalent of the step 890 of the fifth method.

If any of the calculated physical quantities is outside the corresponding specification range, the design data is modified to bring relevant physical quantity within the specification at step 960 in the same manner as at the step 860 of the fifth method. This process may be iteratively applied until compliance with the design rule and satisfaction of all of the specifications are simultaneously achieved, i.e., until the intersect area is equal to or exceeds the predetermined minimum contact area and all the calculated physical quantities are within their respective specification ranges.

Figure 10:
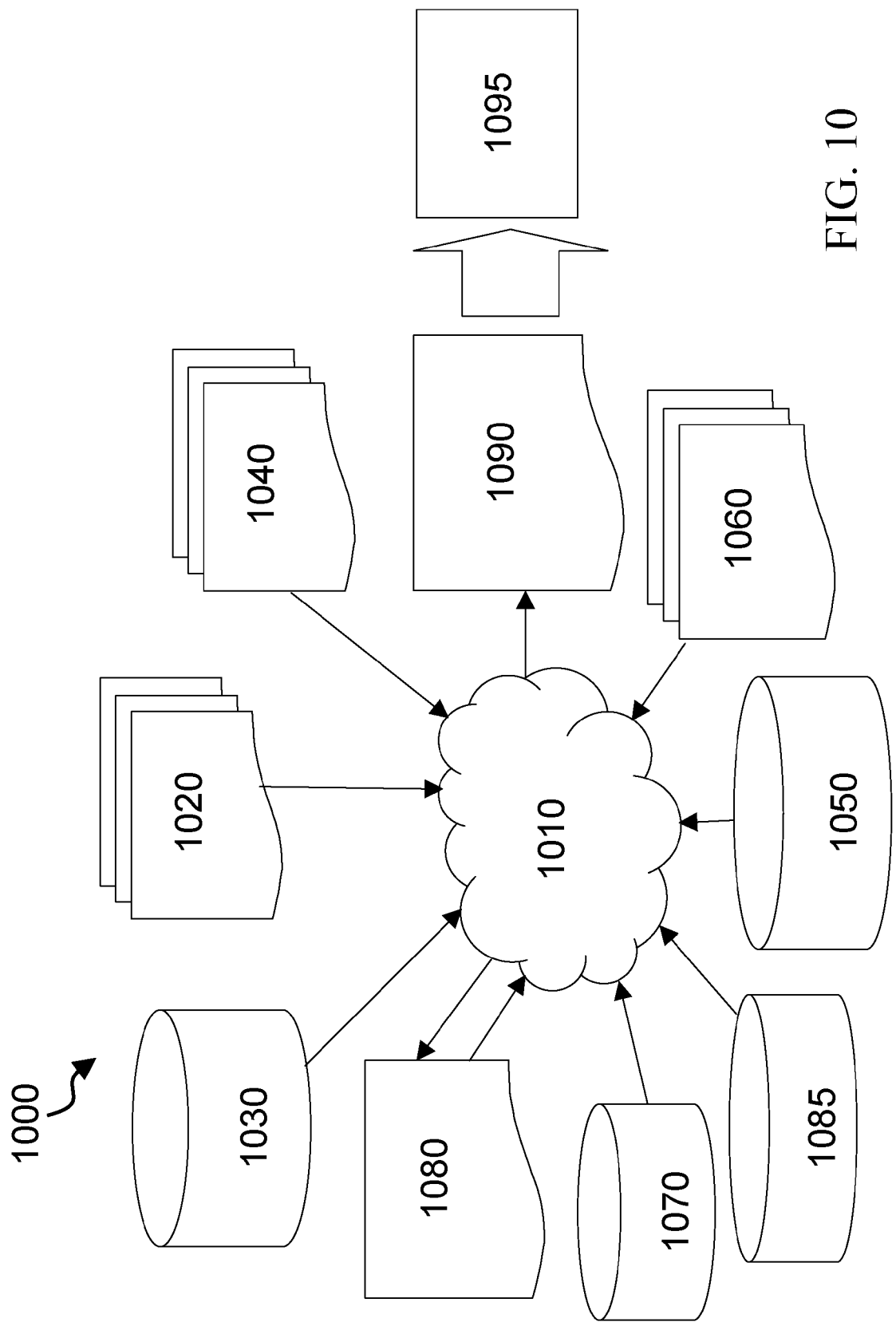
FIG. 10 is a flow diagram of a design process used in semiconductor design and manufacture of the inventive semiconductor circuits according to the present invention.

FIG. 10 shows a block diagram of an exemplary design flow 1000 used for example, in semiconductor design and manufacturing. Design flow 1000 may vary depending on the type of IC being designed. For example, a design flow for building an application specific integrated circuit (ASIC) may differ from a design flow for designing a standard integrated circuit component. Design structure 1020 is preferably an input to a design process 1010 and may come from an intellectual property (IP) provider, a core developer, or a design company, or may be generated by the operator of a design flow, or may come from other sources. The design structure 1020 includes the design data of the present invention including the design shapes in the embodiments of the present invention.

Design structure 1020 comprises an embodiment of present invention in the form of schematics or HDL, hardware description language (e.g. Verilog, VHDL, C, etc.) The design structure 1020 may be contained on one or more machine readable medium. For example, design structure 1020 may be a text file or a graphical representation of an embodiment of the invention.

Design process 1010 preferably synthesizes (or translates) an embodiment of the invention into a netlist 1080, where the netlist 1080 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 1080 is resynthesized one or more times depending on design specifications and parameters for the circuit.

During the resynthesis, relevant intersect areas between pairs of design shapes are identified. Each pair of the design shapes includes a first design shape and a second design shape described above. Further, relevant physical quantities derived from the intersect area may also be identified. Determination is made as to whether the intersect area is equal to or exceeds a predetermined minimum intersect area. Further, determination may also be made as to whether a value for a physical quantity derived from the intersect area, which is calculated employing a predefined formula, is within a predefined specification for the physical quantity. If the intersect area is equal to or exceeds a predetermined minimum intersect area, the design data is output as a data structure 1090 in a machine readable medium. Compliance with the predefined specification for the physical quantity may also be imposed as a precondition for outputting the data structure 1090 in addition to the condition of the intersect area being equal to or exceeding the predetermined minimum intersect area. In this case, the design data is output as a data structure 1090 in a machine readable medium if the value for the physical quantity is within the predefined specification as well.

If the intersect area is less than the predetermined intersect area at a step that determines whether the intersect area is equal to or exceeds a predetermined minimum intersect area, at least one of the first design shape and the second design shape is iteratively modified to increase the intersect area. The design data is output as a data structure 1090 in a machine readable medium only if the intersect area is equal to or exceeds a predetermined minimum intersect area after the iterative modifications on at least one of the first design shape and the second design shape. If compliance with the predefined specification for the physical quantity is an additional precondition for outputting the data structure 1090, at least one of the first design shape and the second design shape is iteratively modified until the value for the physical quantity is within the predefined specification. In this case, the design data is output as a data structure 1090 in a machine readable medium only if the value for the physical quantity is within the predefined specification.

The design process 1010 may include using a variety of inputs; for example, inputs from library elements 1030 which may house a set of commonly used elements, circuits, and devices, including models, layouts, and symbolic representations, for a given manufacturing technology (e.g., different technology nodes such as 32 nm, 45 nm, and 65 nm, etc.), design specifications 1040, characterization data 1050, verification data 1060, design rules 1070, and test data files 1085 (which may include, for example, standard circuit design processes such as timing analysis, verification, design rule checking, place and route operations, etc. One of ordinary skill in the art of integrated circuit design can appreciate the extent of possible electronic design automation tools and applications used in the design process 1010 without deviating from the scope and spirit of the present invention. The design structure of the present invention is not limited to any specific design flow.

Design process 1010 preferably translates an embodiment of the invention along with any additional integrated circuit deign or data (if applicable), into the data structure 1090. Data structure 1090 resides on a storage medium in a data format used for the exchange of layout data of integrated circuits and/or symbolic data format (e.g., information stored in GDSII (GDS2), GL1, OASIS, map files, or any other suitable format for storing such design structures). Data structure 1090 may comprise information such as, for example, symbolic data, map files, test data files, design content files, manufacturing data, layout parameters, wires, levels of metal, vias, shapes, data for routing though the manufacturing line, and any other data required by a semiconductor manufacturer to produce an embodiment of the invention as shown in FIGS. 5-9. Data structure 1090 may then proceed to a stage 1095 where, for example, data structure 1090 proceeds to tape-out, is released to manufacturing, is released to a mask house, is sent to another design house, is sent back to a customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method for designing a semiconductor chip comprising:
   determining, employing a design automation tool configured to run an automated program, an intersect area between a first projected physical area of a first design shape and a second projected physical area of a second design shape;
   determining, employing said design automation tool, whether said intersect area is equal to or exceeds a predetermined value;
   modifying, employing said design automation tool, at least one of said first and second design shapes if said intersect area is less than said predetermined value, until said intersect area is equal to or exceeds said predetermined value;
   creating, employing said design automation tool, design data comprising at least said first and second design shapes having said intersect area not less than said predetermined value;
   storing, employing said design automation tool, said design data in a non-transitory machine-readable tangible storage medium, wherein said non-transitory machine-readable tangible storage medium is structurally altered during said storing said design data representing a design; and
   generating, employing said design automation tool, said design for said semiconductor chip based upon said design data.

2. The method of claim 1, wherein said first design shape corresponds to a first physical structure in said semiconductor chip and said second design shape corresponds to a second physical structure in said semiconductor chip, wherein said second physical structure overlies or underlies said first physical structure.

3. The method of claim 2, wherein said first design shape corresponds to a first physical structure in said semiconductor chip and said second design shape corresponds to a second physical structure in said semiconductor chip, wherein said first physical structure vertically abuts said second physical structure.

4. The method of claim 2, wherein said first design shape resides in a first design level and said second design shape resides in a second design level, and wherein said first design level and said second design level are different from each other.

5. The method of claim 4, wherein said first design level contains at least one conductive line and said second design level contains at least one conductive via.

6. The method of claim 2, wherein said first physical structure and said second physical structure are separated by an insulating structure therebetween.

7. The method of claim 6, wherein said first design shape contains at least one conductive line and said second design shape is located in a semiconductor substrate.

8. The method of claim 1, wherein said determining of said first projected physical area comprises applying a line edge bias correction to said first design shape.

9. The method of claim 8, wherein said determining of said first projected physical area further comprises applying a corner rounding correction to said first design shape.

10. The method of claim 8, wherein said line edge bias correction includes lithographic variations in a width of a printed image corresponding to said first design shape and overlay tolerance between said first design shape and said second design shape.

11. The method of claim 8, wherein said second design shape is a shape of a via, and wherein said second projected physical area is a circle having a diameter of a physical structure of said via.

12. The method of claim 1, wherein said design data comprises a netlist.

13. The method of claim 1, wherein said design data resides on said non-transitory machine-readable tangible storage medium in a data format used for exchange of layout data of integrated circuits.

14. A method for designing a semiconductor chip comprising:
   determining, employing a design automation tool configured to run an automated program, an intersect area between a first projected physical area of a first design shape and a second projected physical area of a second design shape;
   determining, employing said design automation tool, whether said intersect area is equal to or exceeds a predetermined value;
   determining, employing said design automation tool, whether a value for a physical quantity derived from said intersect area is within a predefined specification for said physical quantity;
   modifying, employing said design automation tool, at least one of said first and second design shapes if said intersect area is less than said predetermined value or if said value is outside said predefined specification, until said intersect area is equal to or exceeds said predetermined value and said physical quantity is within said predefined specification;
   creating, employing said design automation tool, design data comprising at least said first and second design shapes having said intersect area not less than said predetermined value and having said value for said physical quantity at or within said predefined specification;
   storing, employing said design automation tool, said design data in a non-transitory machine-readable tangible storage medium, wherein said non-transitory machine-readable tangible storage medium is structurally altered during said storing said design data representing a design; and
   generating, employing said design automation tool, said design for said semiconductor chip based upon said design data.

15. The method of claim 14, wherein said first design shape corresponds to a first physical structure in said semiconductor chip and said second design shape corresponds to a second physical structure in said semiconductor chip, wherein said second physical structure overlies or underlies said first physical structure.

16. The method of claim 15, wherein said first design shape corresponds to a first physical structure in said semiconductor chip and said second design shape corresponds to a second physical structure in said semiconductor chip, wherein said first physical structure vertically abuts said second physical structure.

17. The method of claim 16, wherein said physical quantity is electrical resistance of contact between said first physical structure and said second physical structure, electromigration resistance of a collective structure of said first physical structure and said second physical structure, or expected functional yield of said collective structure of said first physical structure and said second physical structure.

18. The method of claim 15, wherein said first design shape resides in a first design level and said second design shape resides in a second design level, and wherein said first design level and said second design level are different from each other.

19. The method of claim 18, wherein said first design level contains at least one conductive line and said second design level contains at least one conductive via.

20. The method of claim 15, wherein said first physical structure and said second physical structure are separated by an insulating structure therebetween.

21. The method of claim 15, wherein said first design shape corresponds to a first physical structure in said semiconductor chip and said second design shape corresponds to a second physical structure in said semiconductor chip, wherein said first physical structure abuts said second physical structure.

22. The method of claim 14, wherein said determining of said first projected physical area comprises:
applying a line edge bias correction to said first design shape; and
applying a corner rounding correction to said first design shape.

23. The method of claim 22, wherein said line edge bias correction includes lithographic variations in a width of a printed image corresponding to said first design shape and an overlay tolerance between said first design shape and said second design shape.

24. The method of claim 14, wherein said second design shape is a shape of a via, and wherein said second projected physical area is a circle having a diameter of a physical structure of said via.

25. The method of claim 14, wherein said design data resides on said non-transitory machine-readable tangible storage medium in a data format used for exchange of layout data of integrated circuits.

* * * * *